(12) United States Patent
Chang et al.

(10) Patent No.: US 8,774,980 B2
(45) Date of Patent: Jul. 8, 2014

(54) CONTAINER DATA CENTER AND COOLING SYSTEM THEREOF

(75) Inventors: Yao-Ting Chang, Taipei Hsien (TW); Chao-Ke Wei, Taipei Hsien (TW); Hung-Chou Chan, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 428 days.

(21) Appl. No.: 12/884,214

(22) Filed: Sep. 17, 2010

(65) Prior Publication Data
US 2012/0048756 A1 Mar. 1, 2012

(30) Foreign Application Priority Data

Aug. 26, 2010 (TW) .............................. 99128717 A

(51) Int. Cl.
- G05D 23/00 (2006.01)
- A47F 3/04 (2006.01)
- H05K 5/00 (2006.01)
- G06F 1/16 (2006.01)
- H05K 7/00 (2006.01)

(52) U.S. Cl.
USPC ...... 700/300; 62/259.2; 454/184; 361/679.34

(58) Field of Classification Search
USPC ........ 700/300; 361/679.34, 679.46, 695, 696; 62/259.2; 454/184; 165/104.31, 104.33
See application file for complete search history.

(56) References Cited

U.S. PATENT DOCUMENTS

| 7,088,585 B2* | 8/2006 | Chu et al. ...................... 361/699 |
| 7,525,207 B2* | 4/2009 | Clidaras et al. ................. 290/43 |
| 7,551,971 B2* | 6/2009 | Hillis ............................... 700/90 |
| 8,223,495 B1* | 7/2012 | Carlson et al. ................ 361/701 |
| 8,274,790 B2* | 9/2012 | Campbell et al. ............. 361/696 |
| 8,297,069 B2* | 10/2012 | Novotny et al. ............. 62/259.2 |
| 8,553,416 B1* | 10/2013 | Carlson et al. ................ 361/701 |
| 2009/0126910 A1* | 5/2009 | Campbell et al. ........ 165/104.33 |
| 2009/0295167 A1* | 12/2009 | Clidaras et al. ................. 290/55 |
| 2010/0018228 A1* | 1/2010 | Flammang et al. ............. 62/115 |
| 2010/0078160 A1* | 4/2010 | Novotny et al. .............. 165/247 |
| 2010/0236772 A1* | 9/2010 | Novotny et al. .............. 165/287 |
| 2011/0225997 A1* | 9/2011 | Gast et al. ........................ 62/121 |
| 2012/0127656 A1* | 5/2012 | Driggers .................. 361/679.47 |

* cited by examiner

Primary Examiner — Mohammad Ali
Assistant Examiner — Ziaul Karim
(74) Attorney, Agent, or Firm — Novak Druce Connolly Bove + Quigg LLP

(57) ABSTRACT

A cooling system includes a first temperature sensor, a pump, a first controller, and a first filtering device. The first temperature sensor senses a temperature of an external water source and outputs a first temperature value. The pump pumps the water from the external water source. The first controller is connected between the first temperature sensor and the pump to receive the first temperature value, and compare the first temperature value with a first predetermined temperature value. If the first temperature value is less than the first predetermined temperature value, the first controller controls the pump to pump the water from the external water source. The first filtering device is connected to the pump to receive and filter the pumped water and output the filtered water to a cold water pipe of the container data center to cool servers of the container data center.

8 Claims, 2 Drawing Sheets

CONTAINER DATA CENTER AND COOLING SYSTEM THEREOF

BACKGROUND

1. Technical Field

The present disclosure relates to container data centers, and more particularly to a container data center including a cooling system.

2. Description of Related Art

Keeping the temperature below 35 degrees Celsius (° C.) in a container data center helps electronic apparatuses in the container data center work normally. To make a container data center comfortable for users, the temperature inside the container data center is usually controlled to be between 18° C.-27° C. However, because of the heat generated by the electronic apparatuses, a lot of energy is needed to maintain such temperatures, which is expensive.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
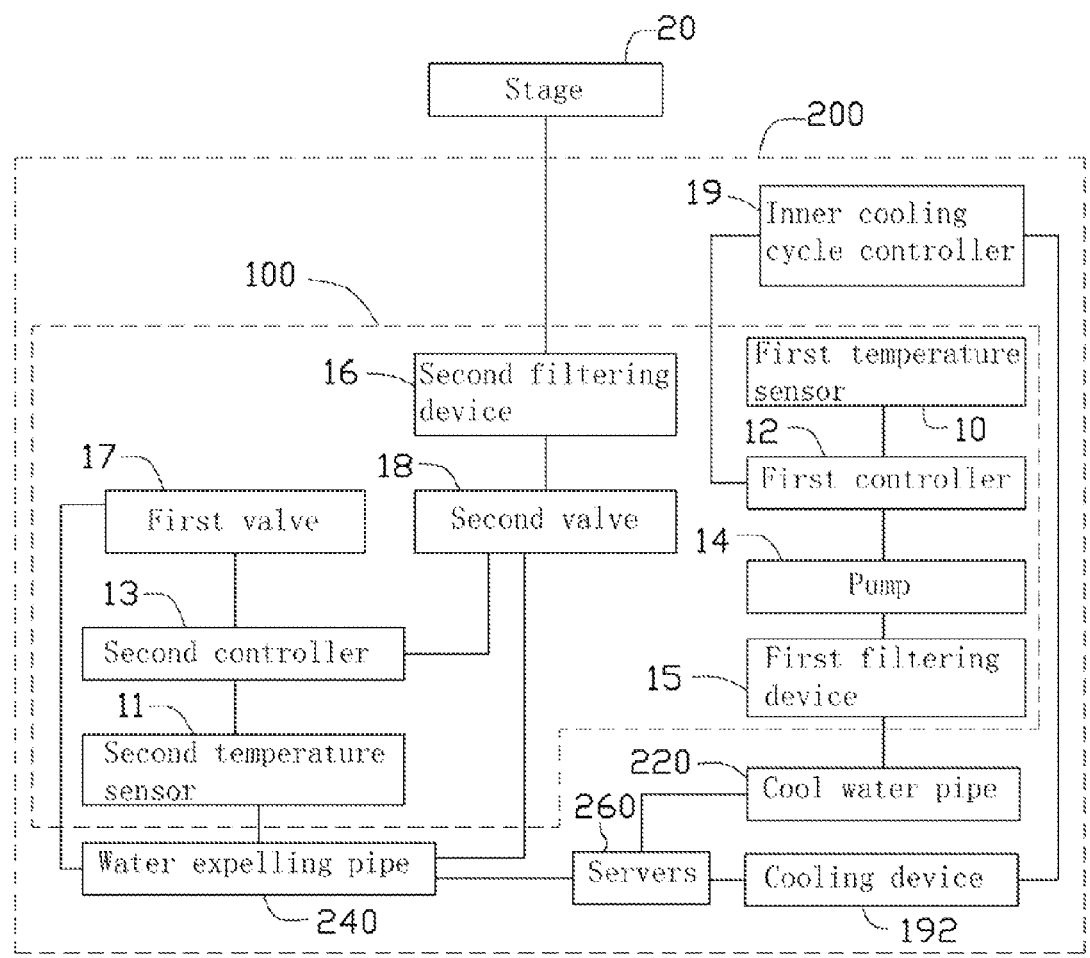
FIG. 1 is a block diagram of an exemplary embodiment of a cooling system.
Figure 2:
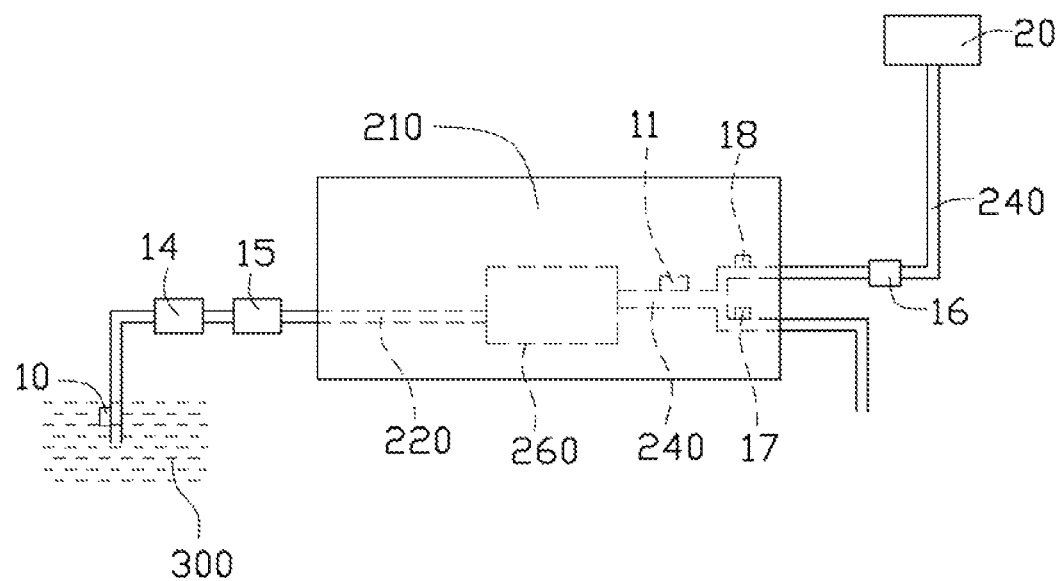
FIG. 2 is an isometric view of an exemplary embodiment of a container data center including the cooling system of FIG. 1.

Referring to FIGS. 1 and 2, an exemplary embodiment of a container data center 200 includes a cooling system 100, a plurality of servers 260, and a cold water pipe 220, and a water outlet pipe 240 connected to the cooling system 100. The cooling system 100 includes a first temperature sensor 10, a second temperature sensor 11, a first controller 12, a second controller 13, a pump 14, a first filtering device 15, a second filtering device 16, a first valve 17, a second valve 18, a container 210, and an inner cooling controller 19. The cooling system 100 is used to cool the servers 260. In the embodiment, the first temperature sensor 10, the pump 14, and the first and second filtering devices 15 and 16 are mounted outside the container 210. The second temperature sensor 11, the first and second controllers 12 and 13, the first and second valves 17 and 18, and the inner cooling controller 19 are mounted in the container 210. In other embodiments, the first and second temperature sensors 10 and 11, the first and second controllers 12 and 13, the pump 14, the first and second filtering devices 15 and 16, the first and second valves 17 and 18, and the inner cooling controller 19 can be mounted on other positions according to need.

The first temperature sensor 10 is used to sense a temperature of an external water source 300 near the container 210, and output a first temperature value. In the embodiment, the first temperature sensor 10 is arranged in the external water source 300 to directly sense the temperature of the external water source 300. In addition, the first temperature value is the sensed water temperature value of the first temperature sensor 10 representing the temperature of the external water source 300.

The first controller 12 is connected to the first temperature sensor 10, the pump 14, and the inner cooling controller 19, to receive the first temperature value, and compare the first temperature value with a first predetermined temperature value, such as 10 degrees Celsius (° C.). If the first temperature value is greater than the first predetermined value, it denotes that the water from the external water source 300 is not cool enough to cool the servers 260, and the first controller 12 transmits an inner cooling instruction to the inner cooling controller 19. The inner cooling controller 19 receives the inner cooling instruction and controls cooling devices, such as air-conditioners, to cool the servers 260. If the sensed water temperature value is less than or equal to the first predetermined value, it denotes that the water from the external water source 300 is cool enough to cool the servers 260. The first controller 12 controls the pump 14 to pump the water from the external water source 300 to the first filtering device 15.

The first filtering device 15 is connected between the pump 14 and a cold water pipe 220 of the contain data center 200 to filter the water from the pump 14 and output the filtered water to the cold water pipe 220 to cool the servers 260.

Hot water is expelled out of the servers 260 through the water outlet pipe 240. The second temperature sensor 11 is mounted on the water outlet pipe 240 to sense a temperature of the hot water expelled from water outlet pipe 240 connected to the servers 260, and output a second temperature value.

The first and second valves 17 and 18 are connected to the water outlet pipe 240.

To further save energy, heated water expelled from the outlet pipe 240 may be guided to some other applications, such as in office to provide radiant heat or a nearby swimming pool where warm water is useful and welcome and energy can be saved. The second controller 13 is connected to the second temperature sensor 11 to receive the second temperature value, and compare the second temperature value with a second predetermined temperature value, such as 35° C. The second controller 13 is connected to the first and second valves 17 and 18. If the second temperature value is less than or equal to the second predetermined temperature value, it denotes that the water from the water outlet pipe 240 cannot be used for a warm water application 20 connected to the second filtering device 16. The second controller 13 turns on the first valve 17, and turns off the second valve 18. The water from the outlet pipe 240 is expelled to exterior. If the second temperature value is greater than the second predetermined value, it denotes that the water from the outlet pipe 240 is warm enough for the water application 20. The second controller 13 turns off the first valve 17, and turns on the second valve 18. The water from the water outlet pipe 240 is expelled to the second filtering device 16.

The second filtering device 16 is connected between the second valve 18 and the warm water application 20, such as an office, to filter the water from the water outlet pipe 240 and output the filtered water to the warm water application 20.

In other embodiments, the first and second predetermined temperature values can be adjusted according to need.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A cooling system to cool a plurality of servers of a container data center, the cooling system comprising:
   a first temperature sensor arranged in an external water source to sense a temperature of the external water source and output the sensed water temperature value;
   a pump to pump the water from the external water source;
   a first controller connected between the first temperature sensor and the pump to receive the sensed water temperature value, and compare the sensed water temperature value with a first predetermined temperature value, wherein if the sensed water temperature value is less than the first predetermined temperature value, the first controller controls the pump to pump the water from the external water source;
   a first filtering device connected to the pump to receive and filter the pumped water and output the filtered water to a cold water pipe of the container data center to cool the plurality of servers;
   a second temperature sensor to sense a temperature of water from a water outlet pipe of the container data center connected to the plurality of servers, and output a second temperature value;
   a first valve;
   a second valve;
   a second controller connected to the second temperature sensor, the first and second valves to receive the second temperature value, and compare the second temperature value with a second predetermined temperature value; and
   a second filtering device connected between a water application and the second valve, wherein if the second temperature value is greater than the second predetermined temperature value, the second controller turns off the first valve, and turns on the second valve to expel the water from the water outlet pipe to the second filtering device to filter the water expelled from the water outlet pipe and output the filtered water to the water application.

2. The cooling system of claim 1, wherein if the sensed water temperature value is greater than the first predetermined temperature value, the first controller transmits an inner cooling instruction to an inner cooling controller of the container data center to control cooling devices of the container data center to cool the plurality of servers.

3. The cooling system of claim 1, wherein if the second temperature value is less than or equal to the second predetermined temperature, the second controller turns on the first valve, and turns off the second valve to directly expel the water from the water outlet pipe to exterior without filtering by the second filtering device.

4. A container data center comprising:
   a container comprising:
      a plurality of servers received in the container; and
      a cold water pipe;
   a water outlet pipe connected to the plurality of servers to expel hot water for the plurality of servers; and
   a cooling system comprising:
      a first temperature sensor arranged in an external water source to sense a temperature of the external water source and output the sensed water temperature value;
      a first controller connected between the first temperature sensor and the pump to receive the sensed water temperature value, and compare the sensed water temperature value with a first predetermined temperature value, wherein if the sensed water temperature value is less than the first predetermined temperature value, the first controller controls the pump to pump the water from the external water source;
      a first filtering device connected to the pump to receive and filter the pumped water and output the filtered water to the cold water pipe to cool the plurality of servers;
      a second temperature sensor to sense a temperature of the hot water from the water outlet pipe, and output a second temperature value;
      a first valve;
      a second valve;
      a second controller connected to the second temperature sensor, the first and second valves to receive the second temperature value, and compare the second temperature value with a second predetermined temperature value; and
      a second filtering device connected to a water application and the second valve, wherein if the second temperature value is greater than the second predetermined temperature value, the second controller turns off the first valve, and turns on the second valve to expel the hot water from the water outlet pipe to the second filtering device to filter the hot water expelled from the water outlet pipe and output the filtered hot water to the water application.

5. The container data center of claim 4, further comprising an inner cooling controller and a cooling device connected to the inner cooling controller, wherein if the sensed water temperature value is greater than the first predetermined temperature value, the first controller transmits an inner cooling instruction to the inner cooling controller to control the cooling device to cool the plurality of servers.

6. The container data center of claim 4, wherein if the second temperature value is less than or equal to the second predetermined temperature, the second controller turns on the first valve, and turns off the second valve to directly expel the hot water from the water outlet pipe to exterior.

7. The cooling system of claim 1, wherein heated water generated with a second temperature by heating the filtered water through the plurality of servers is provided to be a warm water source of another system different from the cooling system if the second temperature value is greater than a second predetermined temperature value.

8. The cooling system of claim 1, wherein if the sensed water temperature value is greater than the first predetermined temperature value, the first controller stops the pump pumping the water from the external water source.

* * * * *